United States Patent [19]

Choi

[11] Patent Number: 5,427,981
[45] Date of Patent: Jun. 27, 1995

[54] PROCESS FOR FABRICATING METAL PLUS USING METAL SILICIDE FILM

[75] Inventor: Kyeong K. Choi, Kyoungki, Rep. of Korea

[73] Assignee: Hyundai Electronics Industries Co., Ltd., Rep. of Korea

[21] Appl. No.: 194,843

[22] Filed: Feb. 14, 1994

[30] Foreign Application Priority Data

Feb. 17, 1993 [KR] Rep. of Korea .................. 93-2151

[51] Int. Cl.6 .................. H01L 21/44; H01L 21/48
[52] U.S. Cl. .................. 437/195; 437/190; 437/194; 437/200
[58] Field of Search ................ 437/190, 194, 200, 195

[56] References Cited

U.S. PATENT DOCUMENTS

| | | | |
|---|---|---|---|
| 4,818,723 | 4/1989 | Yen | 437/200 |
| 5,084,413 | 1/1992 | Fujita et al. | 437/200 |
| 5,196,373 | 3/1993 | Beasom | 437/200 |
| 5,262,354 | 11/1993 | Cote et al. | 437/194 |

OTHER PUBLICATIONS

Murarka, Refractory silicides for integrated circuits J. Vac. Soc. Tech 17(4) Jul./Aug. 1980, pp. 775-791.

*Primary Examiner*—Olik Chaudhuri
*Assistant Examiner*—H. Jey Tsai
*Attorney, Agent, or Firm*—Merchant, Gould, Smith, Edell, Welter & Schmidt

[57] ABSTRACT

A process for fabricating a metal plug having a uniform surface capable of preventing a junction consumption reaction. The process includes preparing a semiconductor substrate which includes a first wiring layer, an insulating film formed over the first wiring layer and a contact hole formed in the insulating film such that the surface of the insulating film is exposed through the contact hole, forming a polysilicon film to a predetermined thickness over the entire exposed surface of the resulting structure after the formation of the contact hole, forming a photoresist pattern at a bottom portion of the contact hole on which the polysilicon film is disposed, removing an exposed portion of the polysilicon film not hidden by the photoresist pattern and then removing the photoresist pattern, forming a first metal film over the entire exposed surface of the resulting structure after the removal of the photoresist pattern, reacting the first metal film with the polysilicon film by a thermal treatment, thereby forming a metallic silicide film at the bottom portion of the contact hole, removing the remaining first metal film not reacted with the polysilicon film and filling the contact hole with a second metal material for forming a metal plug buried in the contact hole formed with the metallic silicide film.

11 Claims, 3 Drawing Sheets

PROCESS FOR FABRICATING METAL PLUS USING METAL SILICIDE FILM

BACKGROUND OF THE INVENTION

1. Field of the Invention

The present invention relates to a highly integrated semiconductor device having a multi-layer wiring structure, and more particularly, a process for fabricating a metal plug adapted to electrically connect metal wiring layers formed above and beneath an interlayer insulating film in such a semiconductor device.

2. Description of the Prior Art

Generally, such a metal plug is fabricated by forming a contact hole in an interlayer insulating film, forming a silicide film on the bottom surface of the silicide film, and forming a metal layer over the silicide film to fill the contact hole. However, this conventional method has a problem that the silicide film is incompletely formed so that a lower conduction layer is exposed to the metal plug at the peripheral edge of the contact hole. An incomplete silicide film thereby results in an occurrence of a junction consumption reaction and the fabrication of a metal plug having an irregular surface. Such problems encountered in the conventional method will be apparent by referring to the following descriptions made in conjunction with FIGS. 1A and 1B.

FIG. 1A illustrates a semiconductor device having a structure which includes a silicon substrate 10, an insulating film 12 disposed on the silicon substrate 10 and a contact hole 13 formed in the insulating film 12 such that the silicon substrate 10 is partially exposed. On the bottom surface of the contact hole 13, a metallic silicide film 14 is formed such that the silicon substrate 10 is partially exposed at the peripheral edge of the contact hole 13. The formation of the metallic silicide film is achieved by depositing a metal layer made of, for example, titanium, over the bottom surface of the contact hole 13 by use of physical vapor deposition (PVD) process and then annealing the metal layer. The metal layer has a weak portion disposed at the peripheral edge of the contact hole 13. This weak portion of the metal layer is removed by dry treatment. Due to the removal of the weak portion of the metal layer, the silicon substrate 10 is partially exposed at the peripheral edge of the contact hole 13, as mentioned above.

Referring to FIG. 1B, a metal plug 16 is formed in the contact hole 13 to have a recess 15 at the central portion thereof. The formation of the metal plug 16 is achieved by depositing a metal layer made of, for example, tungsten, over the bottom surface of the contact hole 13. The metal plug 16 is in contact with the silicon substrate 10 exposed at the peripheral edge of the contact hole 13. As a result, a junction consumption reaction occurs. The reason why the recess 15 is formed at the upper portion of the metal plug 16 is that the metal from the metal layer forming the metal plug 16 grows on the peripheral edge of the contact hole 13 at a higher rate than that on the central portion of the contact hole 13 due to different incubation times of the metal growing on the silicon substrate 10 and the metallic silicide film 14, thereby causing the metal to be deposited beyond the contact hole 13 and even on the surface of the insulating film 12. Due to the recess 15 formed at the upper surface of the metal plug 16, it is impossible to obtain a uniform coverage of a wiring layer (not shown) formed over the metal plug 16.

SUMMARY OF THE INVENTION

Therefore, an object of the invention is to provide a process for fabricating a metal plug having a uniform surface, thereby capable of preventing a junction consumption reaction.

In accordance with the present invention, this object can be accomplished by providing a process for fabricating a metal plug adapted to electrically connect a lower wiring layer to an upper wiring layer in a semiconductor device, comprising the steps of: preparing a semiconductor substrate which includes a first wiring layer, an insulating film formed over said first wiring layer and a contact hole formed in said insulating film such that a surface of the insulating film is exposed through said contact hole; forming a polysilicon film to a predetermined thickness over the entire exposed surface of the resulting structure after the formation of the contact hole; forming a photoresist pattern at the bottom portion of the contact hole on which said polysilicon film is disposed; removing an exposed portion of the polysilicon film not hidden by said photoresist pattern and then removing the photoresist pattern; forming a first metal film over the entire exposed surface of the resulting structure after the removal of the photoresist pattern; reacting said first metal film with the polysilicon film by thermal treatment thereby forming a metallic silicide film at said bottom portion of the contact hole; removing the remaining first metal film not reacted with the polysilicon film and filling the contact hole with a second metal material for forming a metal plug buried in the contact hole formed with said metallic silicide film.

BRIEF DESCRIPTION OF THE DRAWINGS

Other objects and aspects o invention will become apparent from the following description of embodiments with to the accompanying drawings in which.

DETAILED DESCRIPTION OF THE PREFERRED EMBODIMENTS

Figure 1A:
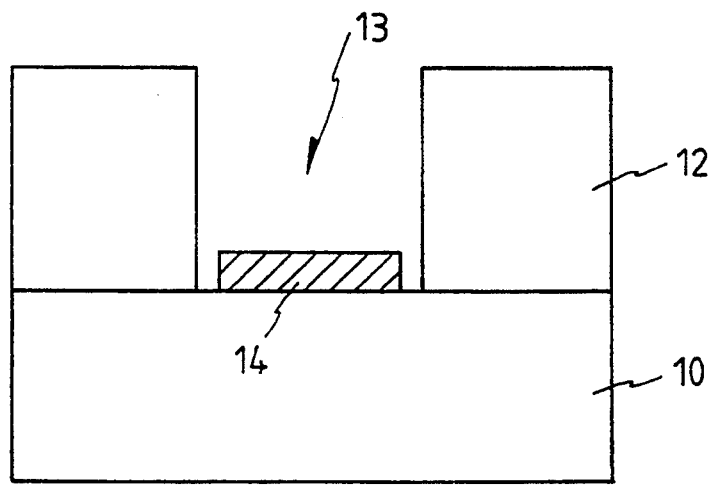
FIGS. 1A and 1B are sectional views respectively illustrating a conventional process for fabricating a metal plug.
Figure 1B:
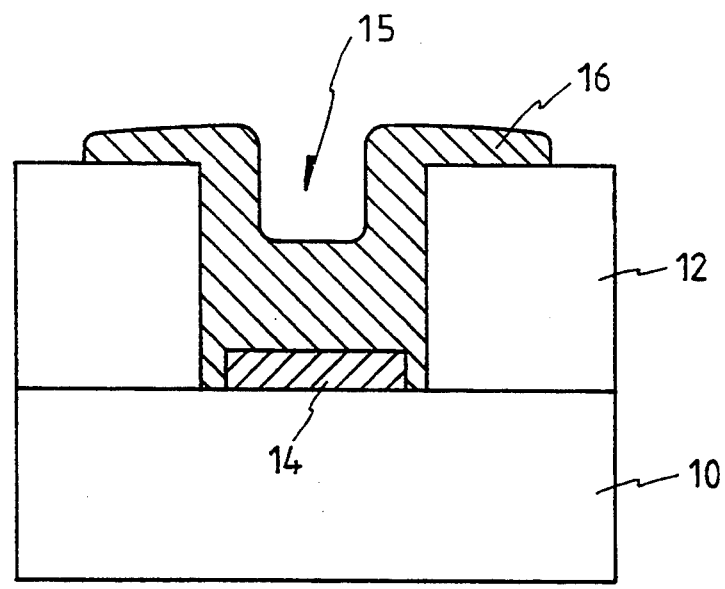
Figure 2A:
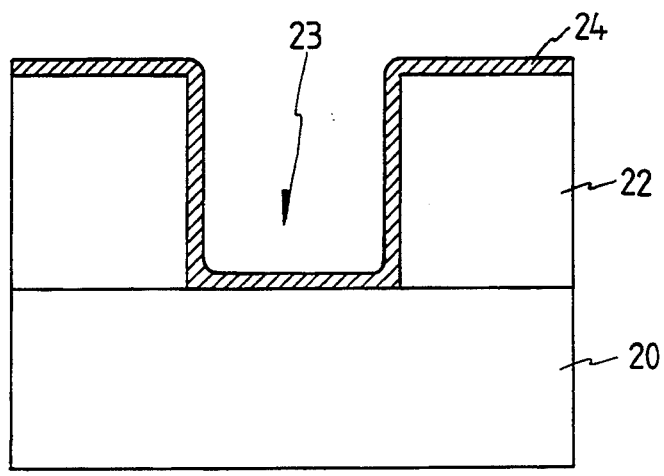
FIGS. 2A to 2F are sectional views respectively illustrating the process for fabricating a metal plug of a semiconductor device in accordance with the present invention.

In accordance with the method, an insulating film 22 is formed over the silicon substrate 20, as shown in FIG. 2A. In the insulating film 22, a contact hole 23 is then formed such that the surface of the silicon substrate 20 is partially exposed. Thereafter, a polysilicon layer 24 is formed to an appropriate thickness of, for example, 500 to 1,600 Å over the entire exposed surface of the resulting structure, including the bottom surface and the side wall of the contact hole 23 and the surface of the insulating film 22. The formation of the polysilicon layer 24 is achieved by use of a low pressure chemical vapor deposition (LPCVD) process wherein the reactive gas of SiH4 reacts chemically in a LPCVD reactor to deposit polysilicon.

Figure 2B:
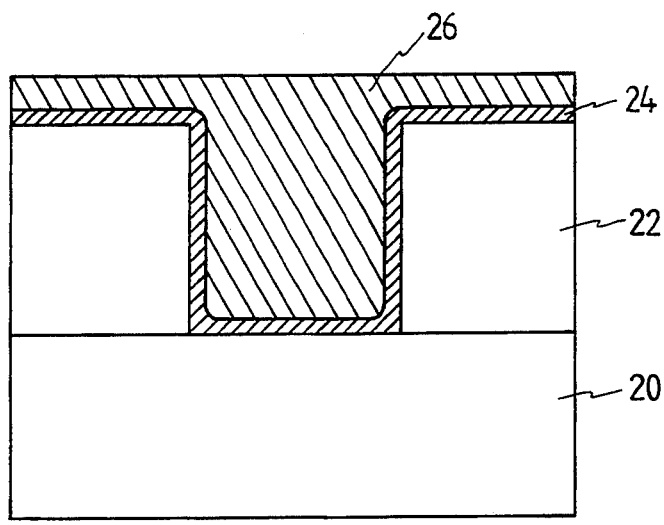

As shown in FIG. 2B, a photoresist film 26 is then coated over the entire exposed surface of the resulting structure such that it fills the contact hole 23.

Figure 2C:
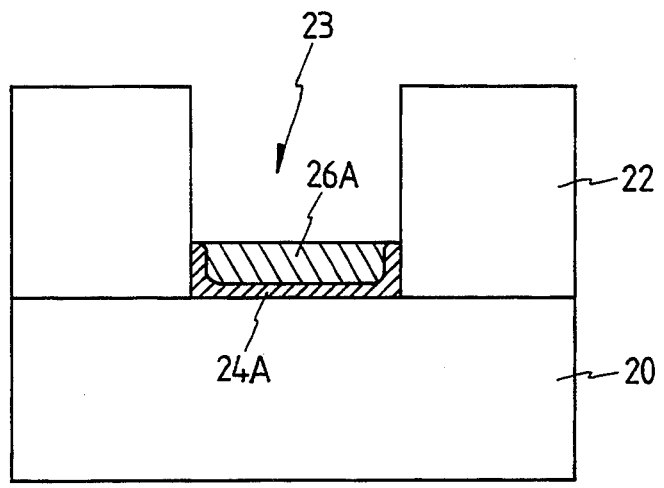

A polysilicon pattern 24A and a photoresist pattern 26A are then formed on the bottom portion of the contact hole 23, as shown in FIG. 2C. The formation of the photoresist pattern 26A is achieved by etching the photoresist film 26 by use of a reactive ion etcher such that it remains only at the bottom portion of the contact hole 23. As the photoresist film 26 is etched, the polysilicon layer 24 is exposed except for portion disposed at the bottom portion of the contact hole 23. The formation of the polysilicon pattern 24A is achieved by removing the exposed portions of the polysilicon layer 24 by use of a wet etching process. After the formation of the polysilicon pattern 24A, the photoresist pattern 26A is completely removed by use of the wet etching process.

Figure 2D:
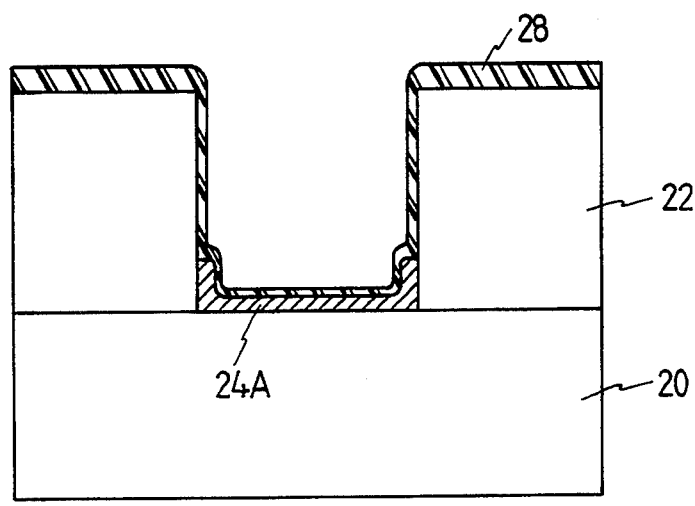

A metal layer 28 having a predetermined thickness is deposited over the entire exposed surface of the resulting structure including the upper surface of the polysilicon pattern 24A, the side wall of the contact hole 23 and the surface of the insulating layer 22, as shown in FIG. 2D. The deposition of the metal layer 28 is achieved by depositing a metal such as titanium, molybdenum, cobalt or manganese by use of a PVD sputtering process.

Figure 2E:
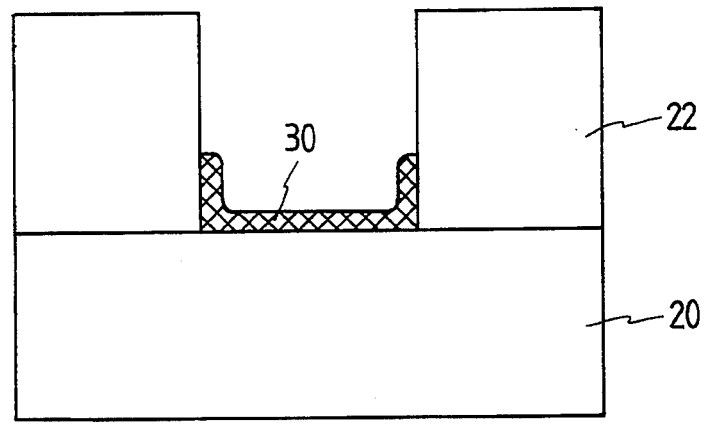

The resulting structure is then subjected to annealing for about 30 minutes in a tube maintained at a temperature about 900° C. In the annealing, the polysilicon pattern 24A and the portion of the metal layer 28 deposited over the polysilicon pattern 24A react with each other, thereby producing a metallic silicide film 30. After the formation of the metallic silicide film 30 disposed at the bottom portion of the contact hole 23, the remaining metal layer 28 is removed, as shown in FIG. 2E.

Figure 2F:
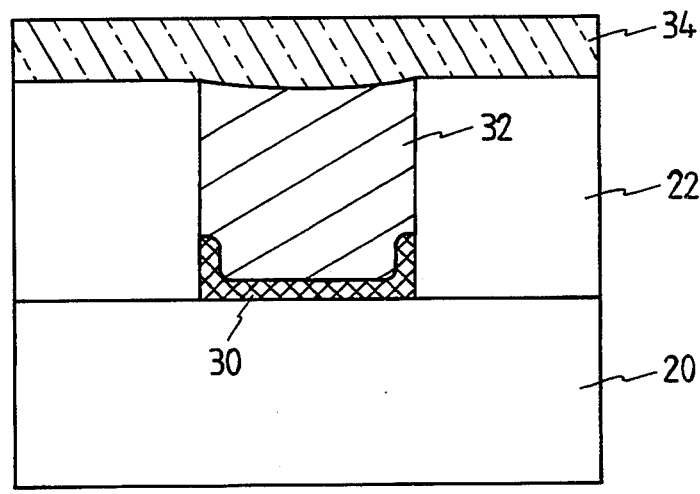

FIG. 2F shows a metal plug 32 buried in the contact hole 23 and a metal wiring layer 34 formed over both the metal plug 32 and the insulating film 22. The formation of the metal plug 32 is achieved by depositing a metal such as tungsten, aluminum or copper over the metallic silicide film 30 formed at the bottom portion of the contact hole 23. After the formation, the metal plug 32 has a planar surface. This is because the surface of the silicon substrate 20 is prevented from being exposed by the metallic silicide film 30 formed at the bottom portion of the contact hole 23. The formation of the metal wiring layer 34 is achieved by depositing an aluminum alloy over both the metal plug 32 and the insulating film 22.

As apparent from the above description, the present invention provides a metal plug fabrication process capable of preventing damage to a polysilicon film formed on the bottom of a contact hole, thereby desirably preventing the silicon substrate from being in direct contact with a silicon substrate. With such an advantage, it is possible to fabricate a metal plug having a planar surface and a metal wiring layer having a uniform thickness. As a result, the occurrence of the junction consumption reaction can be avoided.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A process for fabricating a metal plug adapted to electrically connect a lower wiring layer and an upper wiring layer with each other in a semiconductor device, comprising the steps of:
    preparing a semiconductor substrate which includes a first wiring layer, an insulating film formed over said first wiring layer and a contact hole formed in said insulating film such that a surface of the substrate is exposed through said contact hole;
    forming a polysilicon film over the entire exposed surface of the resulting structure after the formation of the contact hole;
    forming a photoresist pattern at the bottom portion of the contact hole on which said polysilicon film is disposed;
    removing an exposed portion of the polysilicon film and then removing the photoresist pattern;
    forming a first metal film over the entire exposed surface of the insulating layer and remaining polysilicon film after the removal of the photoresist pattern;
    reacting said first metal film with the polysilicon film by annealing, thereby forming a metallic silicide film at said bottom portion of the contact hole;
    removing the remaining first metal film not reacted with the polysilicon film and filling the contact hole with a second metal material for forming a metal plug buried in the contact hole formed with said metallic silicide film.

2. A process in accordance with claim 1, wherein said step of forming said photoresist pattern comprises the steps of coating a photoresist material over the entire exposed surface of the resulting structure after the formation of said contact hole such that said photoresist material covers the upper surface of said polysilicon film, and then etching back said photoresist material such that the photoresist material remains only at said bottom portion of the contact hole.

3. A process in accordance with claim 1, wherein said first metal film is made of titanium.

4. A process in accordance with claim 1, wherein said first metal film is made of molybdenum.

5. A process in accordance with claim 1, wherein said first metal film is made of cobalt.

6. A process in accordance with claim 1, wherein said first metal film is made of manganese.

7. A process in accordance with claim 1, wherein said metal plug is made of tungsten.

8. A process in accordance with claim 1, wherein said metal plug is made of aluminum.

9. A process in accordance with claim 1, wherein said metal plug is made of copper.

10. A process in accordance with claim 1, wherein said step of forming a first metal film over the entire exposed surface of the insulating layer and remaining polysilicon film comprises the step of physical vapor deposition sputtering.

11. A process in accordance with claim 1, wherein said polysilicon film has a predetermined thickness of 500 to 1600 Å.

* * * * *